(12) United States Patent
Tran et al.

(10) Patent No.: US 10,141,062 B2
(45) Date of Patent: Nov. 27, 2018

(54) SENSING CIRCUIT WITH SAMPLED REFERENCE CURRENT OR VOLTAGE FOR FLASH MEMORY SYSTEM

(71) Applicant: Silicon Storage Technology, Inc., San Jose, CA (US)

(72) Inventors: Hieu Van Tran, San Jose, CA (US); Anh Ly, San Jose, CA (US); Thuan Vu, San Jose, CA (US); Hung Quoc Nguyen, Fremont, CA (US); Viet Tan Nguyen, Ho Chi Minh (VN)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/135,445

(22) Filed: Apr. 21, 2016

(65) Prior Publication Data

US 2016/0351268 A1    Dec. 1, 2016

Related U.S. Application Data

(62) Division of application No. 14/726,124, filed on May 29, 2015, now Pat. No. 9,672,930.

(51) Int. Cl.
| | | |
|---|---|---|
| *G11C 11/34* | (2006.01) |
| *G11C 7/02* | (2006.01) |
| *G11C 16/30* | (2006.01) |
| *G11C 16/08* | (2006.01) |
| *G11C 16/10* | (2006.01) |
| *G11C 16/28* | (2006.01) |
| *G11C 8/10* | (2006.01) |
| *G11C 5/14* | (2006.01) |
| *G11C 16/32* | (2006.01) |
| *G11C 29/14* | (2006.01) |

(52) U.S. Cl.
CPC ................ *G11C 16/30* (2013.01); *G11C 8/10* (2013.01); *G11C 16/08* (2013.01); *G11C 16/10* (2013.01); *G11C 16/28* (2013.01); *G11C 5/14* (2013.01); *G11C 16/32* (2013.01); *G11C 29/14* (2013.01); *G11C 2207/2227* (2013.01)

(58) Field of Classification Search
None
See application file for complete search history.

(56) References Cited

U.S. PATENT DOCUMENTS 5,757,719 A * 5/1998 Calligaro ............ G11C 11/5621
365/185.33
5,854,765 A   12/1998 Shinozaki
(Continued)

FOREIGN PATENT DOCUMENTS

WO   2006103484 A1   10/2006

OTHER PUBLICATIONS

U.S. Appl. No. 14/602,262, filed Jan. 2015, Tran, et al.
International Search Report dated Sep. 19, 2016 from the related PCT US2016/029390.

*Primary Examiner* — Harry W Bryne
*Assistant Examiner* — Sultana Begum
(74) *Attorney, Agent, or Firm* — Brent Yamashita; DLA Piper LLP US

(57) ABSTRACT

A circuit and method are disclosed for operating a non-volatile memory device, comprising time sampling a reference current or voltage in a floating holding node to obtain a hold voltage and applying the hold voltage in sensing circuitry.

14 Claims, 17 Drawing Sheets

(56) References Cited

U.S. PATENT DOCUMENTS

| | | | |
|---|---|---|---|
| 5,970,018 A | 10/1999 | Iwata et al. | |
| 6,169,419 B1 | 1/2001 | Beverton | |
| 6,819,612 B1* | 11/2004 | Achter | G11C 7/065 365/189.11 |
| 7,738,298 B2 | 6/2010 | Chae | |
| 7,868,375 B2 | 1/2011 | Liu et al. | |
| 8,149,627 B2* | 4/2012 | Liao | G11C 7/02 365/185.21 |
| 2006/0000917 A1* | 1/2006 | Kim | G06K 19/07 235/492 |
| 2006/0044907 A1* | 3/2006 | Forbes | G11C 7/062 365/207 |
| 2008/0129345 A1* | 6/2008 | Miyatake | G11C 7/062 327/56 |
| 2012/0307576 A1* | 12/2012 | Sarin | G11C 11/5642 365/189.15 |
| 2013/0106467 A1* | 5/2013 | Mansri | H03K 17/145 327/108 |
| 2014/0140138 A1* | 5/2014 | Tran | G11C 16/0483 365/185.18 |
| 2014/0269030 A1* | 9/2014 | Chih | G11C 11/1673 365/158 |
| 2015/0279304 A1* | 10/2015 | Yoneyama | G06T 1/60 345/211 |

\* cited by examiner

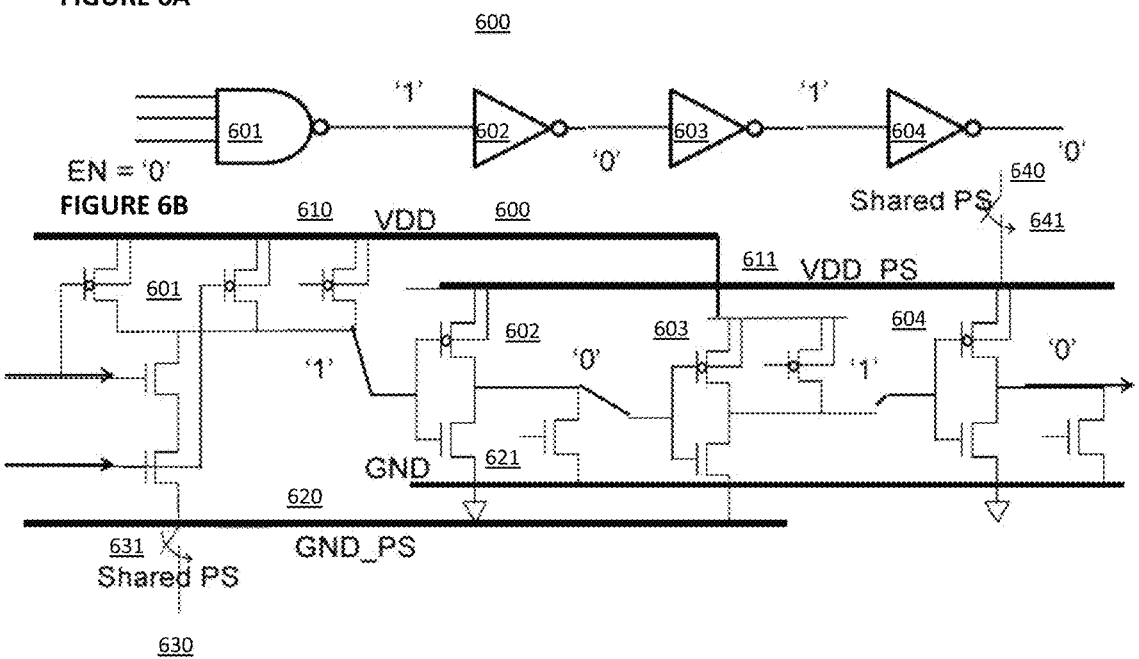

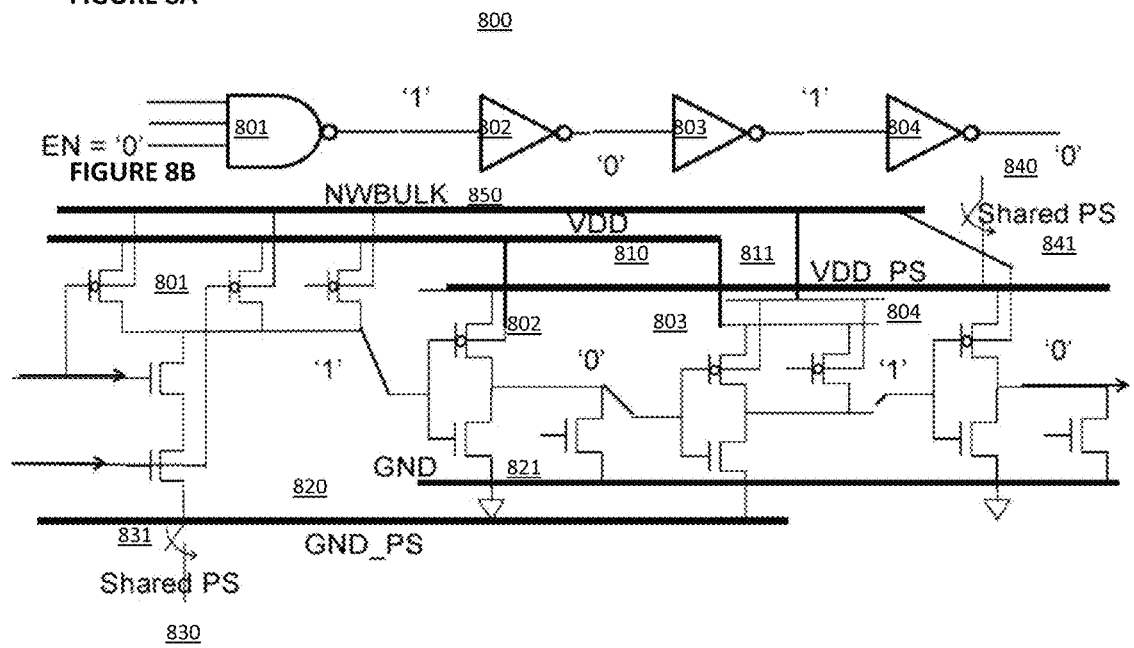

FIGURE 13          1300

SENSING CIRCUIT WITH SAMPLED REFERENCE CURRENT OR VOLTAGE FOR FLASH MEMORY SYSTEM

PRIORITY CLAIM

This application is a divisional of U.S. application Ser. No. 14/726,124, filed on May 29, 2015, and titled "Low Power Operation for Flash Memory System," which is incorporated herein by reference.

TECHNICAL FIELD

The present invention relates to a circuit and method for low power operation in a flash memory system. In one embodiment, a circuit and method are disclosed for operating a non-volatile memory device, comprising time sampling a reference current or voltage in a floating holding node to obtain a hold voltage and applying the hold voltage in sensing circuitry.

BACKGROUND OF THE INVENTION

Non-volatile memory cells are well known in the art. One prior art non-volatile split gate memory cell 10 is shown in FIG. 1. The memory cell 10 comprises a semiconductor substrate 12 of a first conductivity type, such as P type. The substrate 12 has a surface on which there is formed a first region 14 (also known as the source line SL) of a second conductivity type, such as N type. A second region 16 (also known as the drain line) also of N type is formed on the surface of the substrate 12. Between the first region 14 and the second region 16 is a channel region 18. A bit line BL 20 is connected to the second region 16. A word line WL 22 is positioned above a first portion of the channel region 18 and is insulated therefrom. The word line 22 has little or no overlap with the second region 16. A floating gate FG 24 is over another portion of the channel region 18. The floating gate 24 is insulated therefrom, and is adjacent to the word line 22. The floating gate 24 is also adjacent to the first region 14. The floating gate 24 may overlap the first region 14 to provide coupling from the region 14 into the floating gate 24. A coupling gate CG (also known as control gate) 26 is over the floating gate 24 and is insulated therefrom. An erase gate EG 28 is over the first region 14 and is adjacent to the floating gate 24 and the coupling gate 26 and is insulated therefrom. The top corner of the floating gate 24 may point toward the inside corner of the T-shaped erase gate 28 to enhance erase efficiency. The erase gate 28 is also insulated from the first region 14. The cell 10 is more particularly described in U.S. Pat. No. 7,868,375, whose disclosure is incorporated herein by reference in its entirety.

One exemplary operation for erase and program of prior art non-volatile memory cell 10 is as follows. The cell 10 is erased, through a Fowler-Nordheim tunneling mechanism, by applying a high voltage on the erase gate 28 with other terminals equal to zero volt. Electrons tunnel from the floating gate 24 into the erase gate 28 causing the floating gate 24 to be positively charged, turning on the cell 10 in a read condition. The resulting cell erased state is known as '1' state. The cell 10 is programmed, through a source side hot electron programming mechanism, by applying a high voltage on the coupling gate 26, a high voltage on the source line 14, a medium voltage on the erase gate 28, and a programming current on the bit line 20. A portion of electrons flowing across the gap between the word line 22 and the floating gate 24 acquire enough energy to inject into the floating gate 24 causing the floating gate 24 to be negatively charged, turning off the cell 10 in read condition. The resulting cell programmed state is known as '0' state. The memory cell 10 is read in a Current Sensing Mode as following: a bias voltage is applied on the bit line 20, a bias voltage is applied on the word line 22, a bias voltage is applied on the coupling gate 26, a bias or zero voltage is applied on the erase gate 28, and a ground is applied on the source line 14. There exists a cell current flowing from the bit line 20 to the source line 14 for erased state and there is insignificant or zero cell current flow from the bit line 20 to the source line 14 for programmed state. Alternative the memory cell can be read in a Reverse Current Sensing Mode, in which the bit line 20 is grounded and a bias voltage is applied on the source line. In this mode the current reverses the direction from the source line 14 to the bitline 20. The memory cell 10 alternatively can be read in a Voltage Sensing Mode as following: a bias current (to ground) is applied on the bit line 20, a bias voltage is applied on the word line 22, a bias voltage is applied on the coupling gate 26, a bias voltage is applied on the erase gate 28, and a bias voltage is applied on the source line 14. There exists a cell output voltage (significantly >0v) on the bit line 20 for erased state and there is insignificant or close to zero output voltage on the bit line 20 for programmed state. Alternative the memory cell can be read in a Reverse Voltage Sensing Mode, in which the bit line 20 is biased at a bias voltage and a bias current (to ground) is applied on the source line. In this mode the cell output voltage is on the source line 14 instead of on the bit line 20.

In the prior art, various combinations of positive or zero voltages were applied to word line 22, coupling gate 26, and floating gate 24 to perform read, program, and erase operations In response to the read, erase or program command, the logic circuit 270 causes the various voltages to be supplied in a timely and least disturb manner to the various portions of both the selected memory cell 10 and the unselected memory cells 10.

For the selected and unselected memory cell 10, the voltage and current applied are as follows. As used hereinafter, the following abbreviations are used: source line or first region 14 (SL), bit line 20 (BL), word line 22 (WL), and coupling gate 26 (CG).

TABLE NO. 1

| | | | | | | | | | | | |
|---|---|---|---|---|---|---|---|---|---|---|---|
| | | | | | PEO (Positive Erase Operation) Table | | | | | | |
| | WL | WL-unsel | BL | BL-unsel | CG | CG -unsel same sector | CG - unsel | EG | EG-unsel | SL | SL-unsel |
| Read | 1.0-2 V | 0 V | 0.6-2 V | 0 V-FLT | 0-2.6 V | 0-2.6 V | 0-2.6 V | 0-2.6 V | 0-2.6 V | 0 V | 0 V-FLT |
| Erase | 0 V | 0 V | 0 V | 0 V | 0 V | 0-2.6 V | 0-2.6 V | 11.5-12 V | 0-2.6 V | 0 V | 0 V |
| Program | 1 V | 0 V | 1 uA | Vinh | 10-11 V | 0-2.6 V | 0-2.6 V | 4.5-5 V | 0-2.6 V | 4.5-5 V | 0-1 V/FLT |

In a recent application by the applicant—U.S. patent application Ser. No. 14/602,262, filed on Jan. 21, 2015, which is incorporated by reference—the applicant disclosed an invention whereby negative voltages could be applied to word line 22 and/or coupling gate 26 during read, program, and/or erase operations. In this embodiment, the voltage and current applied to the selected and unselected memory cell 10, are as follows.

increased voltages for program and erase operations for memory array 215 and memory array 220, respectively; negative voltage driver circuit 230 shared by memory array 215 and memory array 220 for read and write operations; high voltage driver circuit 225 used by memory array 215 during read and write operations and high voltage driver circuit 226 used by memory array 220 during read and write operations.

TABLE NO. 2

| | | | | | | | | | | | |
|---|---|---|---|---|---|---|---|---|---|---|---|
| | | | | PEO (Positive Erase Operation) Table | | | | | | | |
| | WL | WL - unsel | BL | BL - unsel | CG | CG -unsel same sector | CG - unsel | EG | EG- unsel | SL | SL- unsel |
| Read | 1.0-2 V | −0.5 V/0 V | 0.6-2 V | 0 V-FLT | 0-2.6 V | 0-2.6 V | 0-2.6 V | 0-2.6 V | 0-2.6 V | 0 V | 0 V-FLT |
| Erase | 0 V | 0 V | 0 V | 0 V | 0 V | 0-2.6 V | 0-2.6 V | 11.5-12 V | 0-2.6 V | 0 V | 0 V |
| Program | 1 V | −0.5 V/0 V | 1 uA | Vinh | 10-11 V | 0-2.6 V | 0-2.6 V | 4.5-5 V | 0-2.6 V | 4.5-5 V | 0-1 V/FLT |

In another embodiment of U.S. patent application Ser. No. 14/602,262, negative voltages can be applied to word line 22 when memory cell 10 is unselected during read, erase, and program operations, and negative voltages can be applied to coupling gate 26 during an erase operation, such that the following voltages are applied:

With flash memory systems becoming ubiquitous in all manner of computing and electronic devices, it is increasingly important to create designs that reduce the amount of power consumed by the flash memory system. What is needed is novel circuitry for reducing power consumption in a flash memory system.

TABLE NO. 3

| | | | | | | | | | | | |
|---|---|---|---|---|---|---|---|---|---|---|---|
| | | | | PNEO (Positive Negative Erase Operation) Table | | | | | | | |
| | WL | WL - unsel | BL | BL - unsel | CG | CG -unsel same sector | CG - unsel | EG | EG- unsel | SL | SL- unsel |
| Read | 1.0-2 V | −0.5 V/0 V | 0.6-2 V | 0-FLT | 0-2.6 V | 0-2.6 V | 0-2.6 V | 0-2.6 V | 0-2.6 V | 0 V | 0-FLT |
| Erase | 0 V | −0.5 V/0 V | 0 V | 0-FLT | −(5-9) V | 0-2.6 V | 0-2.6 V | 8-9 V | 0-2.6 V | 0 V | 0 V |
| Program | 1 V | −0.5 V/0 V | 1 uA | Vinh | 8-9 V | CGINH (4-6 V) | 0-2.6 V | 8-9 V | 0-2.6 V | 4.5-5 V | 0-1 V/FLT |

The CGINH signal listed above is an inhibit signal that is applied to the coupling gate 26 of an unselected cell that shares an erase gate 28 with a selected cell.

FIG. 2 depicts an embodiment recently developed by applicant of an architecture for a flash memory system comprising die 200. Die 200 comprises: memory array 215 and memory array 220 for storing data, memory arrays 215 and 220 comprising rows and columns of memory cells of the type described previously as memory cell 10 in FIG. 1, pad 240 and pad 280 for enabling electrical communication between the other components of die 200 and, typically, wire bonds (not shown) that in turn connect to pins (not shown) or package bumps that are used to access the integrated circuit from outside of the packaged chip or macro interface pins (not shown) for interconnecting to other macros on a SOC (system on chip); high voltage circuit 275 used to provide positive and negative voltage supplies for the system; control logic 270 for providing various control functions, such as redundancy and built-in self-testing; analog circuit 265; sensing circuits 260 and 261 used to read data from memory array 215 and memory array 220, respectively; row decoder circuit 245 and row decoder circuit 246 used to access the row in memory array 215 and memory array 220, respectively, to be read from or written to; column decoder circuit 255 and column decoder circuit 256 used to access bytes in memory array 215 and memory array 220, respectively, to be read from or written to; charge pump circuit 250 and charge pump circuit 251, used to provide

SUMMARY OF THE INVENTION

The present invention relates to a circuit and method for low power operation in a flash memory system. In disclosed embodiments of a selection-decoding circuit path, pull-up and pull-down circuits are used to save values at certain output nodes during a power save or shut down modes, which allows the main power source to be shut down while still maintaining the values. Low power read reference generation are described. Address and data encoding, decoding and scrambling to save power is described. In one embodiment, a circuit and method are disclosed for operating a non-volatile memory device, comprising time sampling a reference current or voltage in a floating holding node to obtain a hold voltage and applying the hold voltage in sensing circuitry.

BRIEF DESCRIPTION OF THE DRAWINGS

FIGS. 6A and 6B depict a first embodiment of a selection-decoding circuit path.

FIGS. 8A and 8B depict a third embodiment of a selection-decoding circuit path.

DETAILED DESCRIPTION OF THE PREFERRED EMBODIMENT

Figure 1:
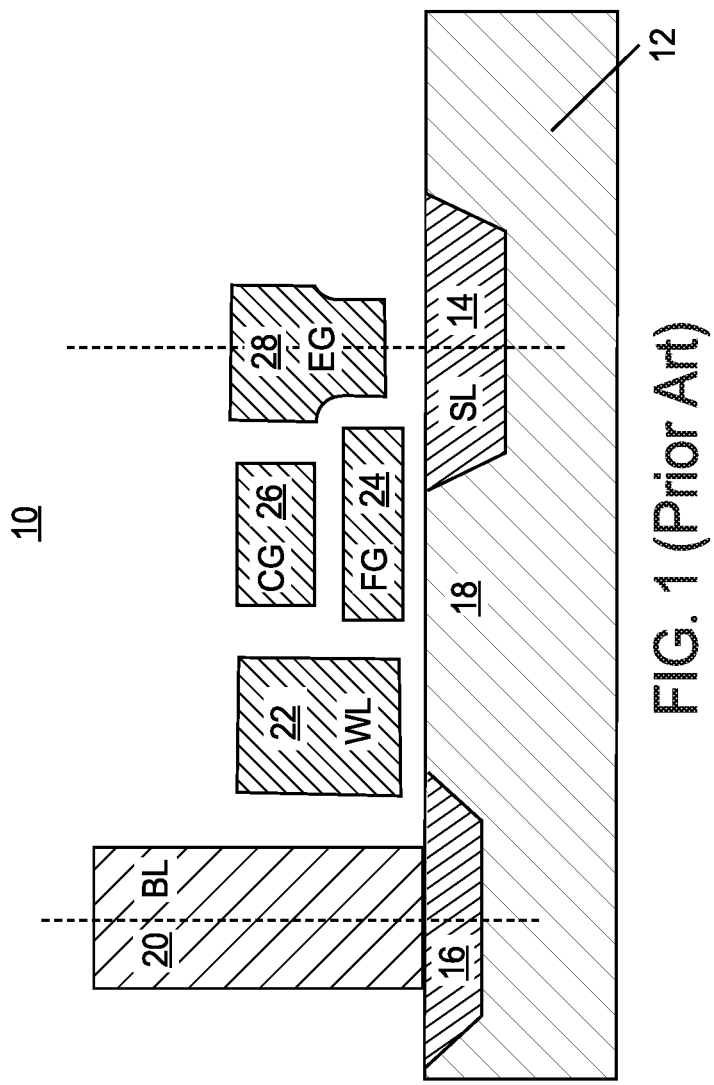
FIG. 1 is a cross-sectional view of a non-volatile memory cell of the prior art to which the method of the present invention can be applied.
Figure 2:
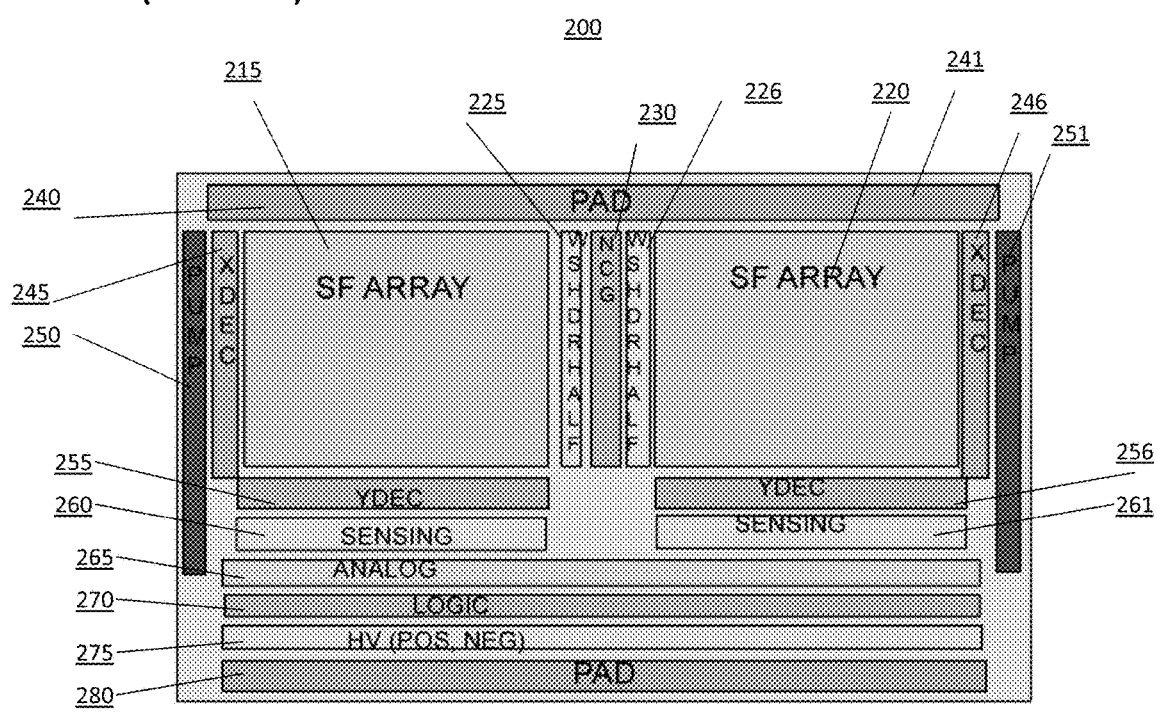
FIG. 2 is a block diagram of a non-volatile memory device using the non-volatile memory cell of the prior art shown in FIG. 1.
Figure 3:
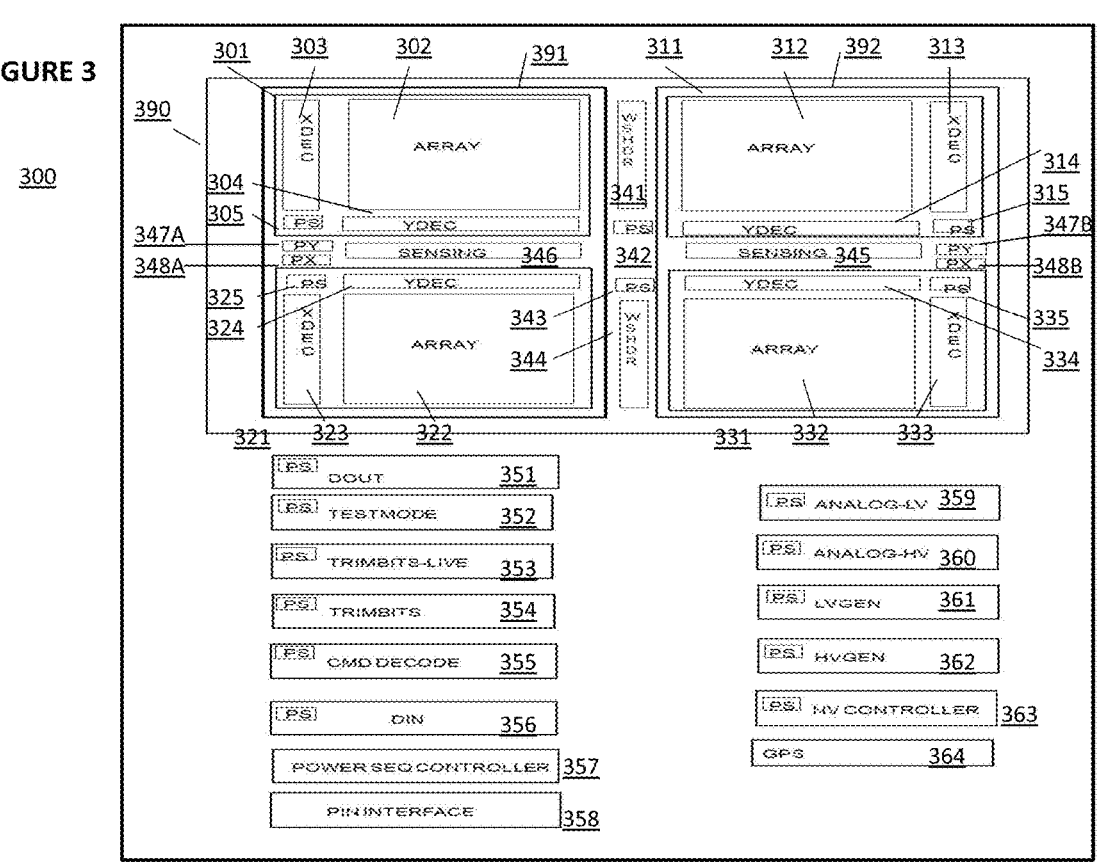
FIG. 3 is a block diagram of an embodiment of a non-volatile memory device.

FIG. 3 depicts an embodiment of an architecture for a flash memory system comprising die 300. Die 300 comprises memory section 390. Memory section 390 comprises memory blocks 391 and 392, where memory block 391 comprises memory arrays 302 and 322 and memory block 392 comprises memory arrays 312 and 332 for storing data, each of memory arrays 302, 312, 322, and 332 comprising rows and columns of memory cells of the type described previously as memory cell 10 in FIG. 1; sensing circuit 346 used to read data from memory arrays 302 and 322 and sensing circuit 345 used to read data from memory arrays 312 and 332; row decoder circuits 303, 313, 323, and 333 used to access the selected row in memory arrays 302, 312, 322, and 332, respectively, to be read from or written to; column decoder circuits 304, 314, 324, and 334 used to access bytes in memory arrays 302, 312, 322, and 332, respectively, to be read from or written to; local power switches 305, 315, 325, and 335 for row decoders 303, 313, 323, and 333; local power switch 347A,347B for column decoder circuits 304, 314, 324, and 334; local power switches 348A,348B for sensing circuits 346 and 345; and local power switches 342 and 343 for high voltage row decoder WSHDR 341 and 344.

Die 300 further comprises the following functional structures and sub-systems: pads (not shown) for enabling electrical communication between the other components of die 300; wire bonds (not shown) that in turn connect to pins (not shown) or package bumps (not shown) that are used to access the integrated circuit from outside of the packaged chip or macro interface pins (not shown) for interconnecting to other macros on a SOC (system on chip); low voltage generation (including a low voltage charge pump circuit) circuits 361 and high voltage generation (including a high voltage charge pump circuit) circuit 362 used to provide increased voltages for program and erase operations for memory arrays 302, 312, 322, and 332; non-volatile operation controller circuit 363 shared by memory arrays 302, 312, 322, and 332 for read and write operations; low voltage generation circuit 361 used by memory arrays 302, 312, 322, and 332; high voltage generation circuit 362 used by memory arrays 302, 312, 322, and 332; analog low voltage circuit 359 and analog high voltage circuit 360 used by analog circuitry on die 300; global power switch (GPS) circuit 364; data out circuit 351; test mode circuit 352; trimbits-live circuit 353; trimbits circuit 354; command decoder circuit 355; data in circuit 356; power sequence controller 357; and pin interface 358. The circuit blocks 351-356,359-363 have local power switches inside their blocks.

Trimbits circuit 354 is used to store bits used during a trimming process whereby certain parameters in the flash memory system are configured, adjusted, and/or optimized. These bits can include non-volatile configuration bits such as algorithm parameters and endurance (number of erase/program cycles) data retention specification configuration bits and non-volatile trimbits such as bits for the high voltage range that are applied to erase gate 28, control gate 26, source line 14; the ranges used for Vinh and Iprog (current for bit line 20 during a programming operation) such as the ones specified in Tables 1-3, above; temperature operating range and timing ranges for erase and program operations.

Trimbits-live circuit 353 is used to store configuration bits used during a normal operation of the flash memory system. These bits can include read trimbits used to configure certain parameters, such as read timing; read bias; voltage ranges that are applied to bitline 20, word line 22, erase gate 28, and control gate 26; Icellref trim values for configuring a reference cell current; and redundancy configuration. These bits also can include read configuration parameters such as read low width, write IO width, read speed, and power mode.

Hard Power Down

A hard power down operation can be implemented on die 300 when the overall system is being shut down through a shut down command from the user, such as when a mobile device containing die 300 is shut down by a user pressing the power button.

During a hard power down of die 300, the following portions are powered down: memory section 390, data out circuit 351; test mode circuit 352; trimbits-live circuit 353; trimbits circuit 354; command decoder circuit 355; data in circuit 356; analog low voltage circuit 359; analog high voltage circuit 360; low voltage generation circuit 361; high voltage generation circuit 362; and non-volatile operation controller circuit 363. Circuits used to assist in the power down mode are described below.

During a hard power down of die 300, the following portions remain powered on: power sequence controller 357; pin interface 358; and GPS circuit 364.

Soft Power Down

A soft power down operation can be implemented on die 300 when the overall system is being shut down through a shut down command from the operating system or similar device, such as when the operating system of a mobile device containing die 300 commands the system to shut down. Circuits used to assist in the power down mode are described below.

During a soft power down of die 300, the following portions are powered down: memory section 390, data out circuit 351; test mode circuit 352; trimbits circuit 354; command decoder circuit 355; data in circuit 356; analog low voltage circuit 359; analog high voltage circuit 360; low voltage generation circuit 361; high voltage generation circuit 362; and non-volatile operation controller circuit 363.

During a soft power down of die 300, the following portions remain powered on: trimbits-live circuit 353; power sequence controller 357; pin interface 358; and GPS circuit 364.

Standby

A standby operation can be implemented on die 300 when the overall system is being placed in a sleep mode, such as when a mobile device containing die 300 is placed in a sleep mode.

During a standby operation of die 300, the following portions are powered down: memory section 390 except for an active portion of the array 390, for example array 322, row decoder 323, column decoder 324, high voltage decoder 344, and power source 325 and 343; data out circuit 351; test mode circuit 352; trimbits circuit 354; data in circuit 356; analog high voltage circuit 360; high voltage generation circuit 362; and non-volatile operation controller circuit 363. Circuits used to assist in the power down mode are described below.

During a standby operation of die 300, the following portions remain powered on: array 322; row decoder 323; column decoder 324; high voltage decoder 344; power source 343; power source 325; trimbits-live circuit 353; command decoder circuit 355; power sequence controller 357; pin interface 358; analog low voltage circuit 359; low voltage generation circuit 361; and GPS circuit 364.

Active Read

An active read mode can be implemented on die 300 when data from the array 390 is needed from a system controller (not shown). A read command is executed to the pin interface 358 from the system controller.

During an active read operation of die 300, the following portions are powered down: memory section 390 except for array 322 (as example data is needed from this array plane); row decoder 323, column decoder 324, power sources 325 and 343, high voltage decoder WSHDR 344; test mode circuit 352; trimbits circuit 354; data in circuit 356; analog high voltage circuit 360; high voltage generation circuit 362; and non-volatile operation controller circuit 363. Circuits used to assist in the power down mode are described below.

During an active read operation of die 300, the following portions remain powered on: array 322; row decoder 323; column decoder 324; power sources 325 and 343; data out circuit 351; trimbits-live circuit 353; command decoder circuit 355; power sequence controller 357; pin interface 358; analog low voltage circuit 359; low voltage generation circuit 361; and GPS circuit 364.

Test Mode

A test mode can be implemented on die 300 when a designer, manufacturer, or other personnel wishes to test die 300.

During a test mode of die 300, the following portions are powered down: memory section 390, data out circuit 351; data in circuit 356; analog low voltage circuit 359; analog high voltage circuit 360; low voltage generation circuit 361; high voltage generation circuit 362; and non-volatile operation controller circuit 363. Circuits used to assist in the power down mode are described below.

During a test mode of die 300, the following portions remain powered on: test mode circuit 352; trimbits-live circuit 353; trimbits circuit 354; command decoder circuit 355; power sequence controller 357; pin interface 358; and GPS circuit 364.

Non-Volatile Operation

Non-volatile operation is the normal operation mode for die 300. In such mode, normal erase, program, and read operations can occur.

During non-volatile operation of die 300, the following portions are powered down: memory section 390 except for a selected portion of the array 390, as example for array 322, row decoder 323, column decoder 324, power sources 325 and 343, high voltage decoder WSHDR 344; data out circuit 351; and test mode circuit 352. Circuits used to assist in the power down mode are described below.

During non-volatile operation of die 300, the following portions remain powered on: a selected portion of the array 390 as example array 322; row decoder 323; column decoder 324; high voltage decoder 344; power sources 325 and 343; trimbits-live circuit 353; trimbits circuit 354; command decoder circuit 355; data in circuit 356; power sequence controller 357; pin interface 358; analog low voltage circuit 359; analog high voltage circuit 360; low voltage generation circuit 361; high voltage generation circuit 362; non-volatile operation controller circuit 363; and GPS circuit 364.

Circuits for Power Down

FIGS. 4A, 4B, 5A, and 5B depict NAND and INVERTER power save gate circuits used during a power down of various portions of die 300 as discussed above. The gate circuits in FIG. 4A/4B and 5A/5B ensure that the output is known '0' or '1' state in power down mode respectively. Other circuit embodiments for other type of gate circuits such as NOR, XOR, complex gate are similar.

Figure 4A:
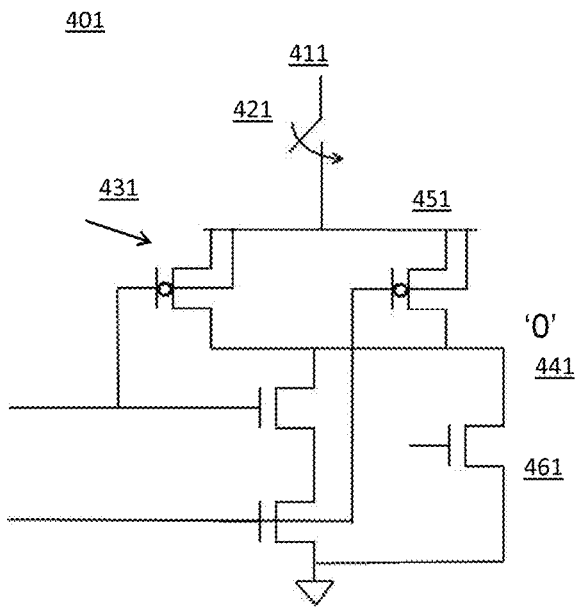
FIGS. 4A and 4B depict embodiments of pull-down circuits.

FIG. 4A depicts pull down 2-input NAND gate circuit 401. Pull down gate circuit 401 pulls output node 441 down to a "0" state (such as a ground voltage) during a power down mode. During the power down mode, switch 421 is opened (off), this dis-connecting node 411 (top power supply) to node 451 (local power supply) of the circuit 431. Device 461 (an additional device to 2-input NAND gate) is turned on by a power down signal to pull node 441 to a "0" state.

Figure 4B:
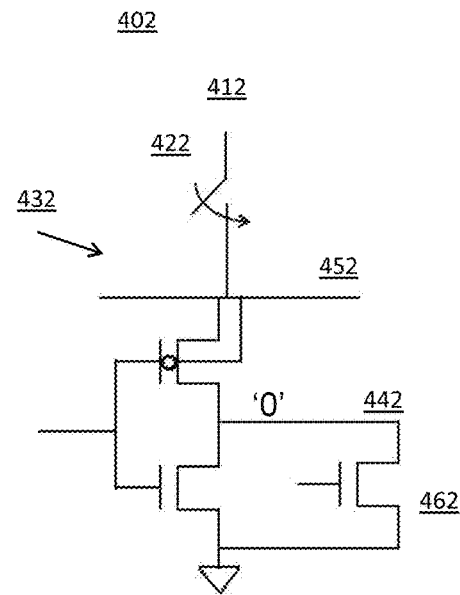

FIG. 4B depicts pull down INVERTER circuit 402. Pull down circuit 402 pulls node 442 down to a "0" state (such as a ground voltage) during a power down mode. During the power down mode, switch 422 is opened (off), thus disconnecting node 412 (top power supply) to node 452 (local power supply) of the circuit 432. Device 462 (an additional device to an inverter) is turned on by a power down signal to pull node 442 to a "0" state.

Figure 5A:
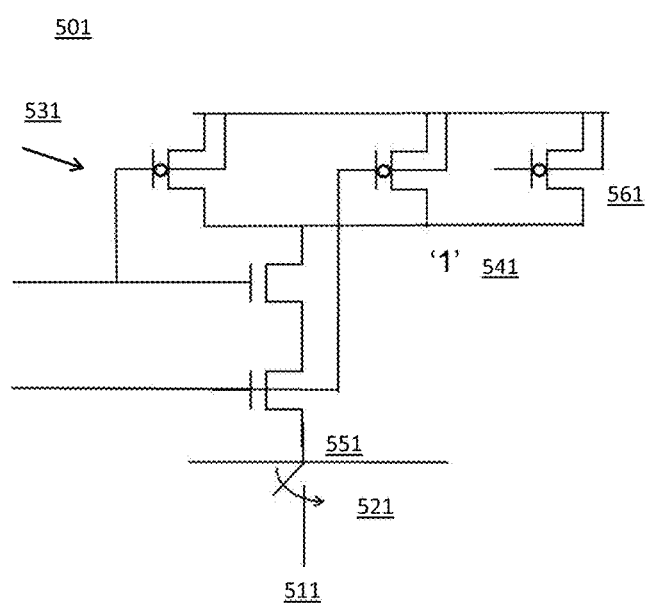
FIGS. 5A and 5B depict embodiments of pull-up circuits.

FIG. 5A depicts pull up 2-input NAND circuit 501. Pull up circuit 501 pulls node 541 to a "1" state (such as a Vdd voltage) during a power down mode. During the power down mode, switch 521 is opened (off), thus dis-connecting node 511 (top ground node) to node 551 (local ground node) of the circuit 531. Device 561 is turned on by a power down signal to pull node 541 up to a "1" state.

Figure 5B:
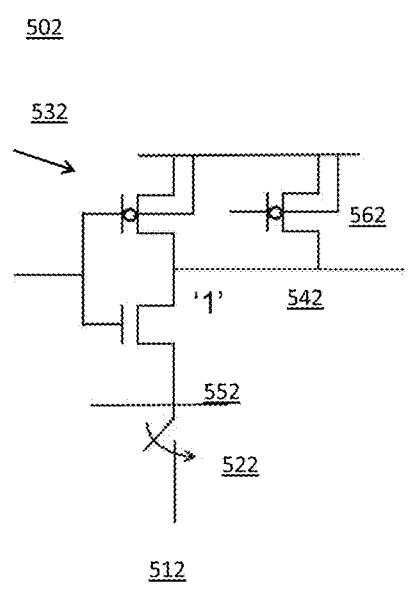

FIG. 5B depicts pull up INVERTER circuit 502. Pull up circuit 502 pulls node 542 to a "1" state (such as a Vdd voltage) during a power down mode. During the power down mode, switch 522 is opened (off), thus dis-connecting node 512 (top ground node) to node 552 (local ground node) of the circuit 532. Device 562 is turned on by a power down signal to pull node 542 up to a "1" state.

Selection-Decoding Circuits

FIGS. 6A, 6B, 7A, 7B, 8A, and 8B depicts various embodiments of selection-decoding circuits that can operate in a low-power shutdown mode.

FIG. 6A depicts selection-decoding circuit 600, which comprises NAND gate 601 and inverters 602, 603, and 604 and is shown in symbolic fashion.

Other selection-decoding and block circuits similar to those in FIG. 6A, 6B.7A, 7B, 8A, 8B, and 9 employing other type of gate circuits such as NOR and/or complex gate are implemented in similar fashion.

FIG. 6B depicts selection-decoding circuit 600 at a transistor level. During a power down event, it is desired to "save" (hold) the output values of NAND gate 601 and inverters 602, 603, and 604 even while the power source VDD and ground GND are turned off, using power save gate circuit techniques as in FIG. 4A, 4B, 5A, and 5B. NAND gate 601 and inverter 603 is similarly to power gate pull up circuit 501 and pull up circuit 502. Inverter gate 602 and inverter 604 is similarly to power gate pull down circuit 401 and pull down circuit 402. Thus NAND gate 601 is coupled to top ground node 630 through switch 631, which can be a form of switch 521 or switch 522 in FIGS. 5A and 5B, in the manner shown in FIG. 6B. Node 630 (top ground line), which is coupled to ground power-save line 620 (also labeled as GND_PS) corresponds to node 511 or node 512 in FIGS. 5A and 5B. When switch 631 is opened (off), the output of NAND 601 will be a "1" and will remain in that state while switch 631 is opened. Inverter 603 also is coupled through the switch 631 to ground power-save line 620 and will output a "1" during the power down mode. Thus, during a power down event, the outputs of NAND gate 601 and inverter 603 will be pulled up to a "1" state.

During the power down event, inverter 604 is coupled to top power supply line node 640 through switch 641, which can be a form of switch 421 or switch 422 in FIGS. 4A and 4B. Node 640, which is coupled to VDD power-save line 611 (also labeled as VDD_PS) corresponds to node 411 or node 412 in FIGS. 4A and 4B. Pulling VDD power-save line 611 to a "0" state will cause the output of inverter 604 to be "saved" as a "0." Inverter 602 also is coupled to VDD power-save line 611 and will have its output "saved" as a "0." Thus, during a power down event, the outputs of inverters 602 and 604 will be pulled down to a "0" state.

Figure 7A:
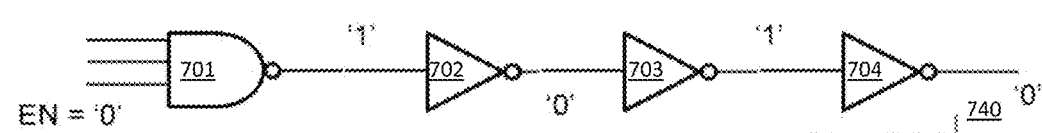
FIGS. 7A and 7B depict a second embodiment of a selection-decoding circuit path.

FIG. 7A depicts selection-decoding circuit 700, which comprises NAND gate 701 and inverters 702, 703, and 704 and is shown in symbolic fashion. NAND gate 701 and inverter 703 is similarly to power gate pull up circuit 501 and pull up circuit 502 (except no device 562 as in FIG. 5B). Inverter gate 702 and inverter 704 is similarly to power gate pull down circuit 401 and pull down circuit 402 except there is no device 562 as FIG. 5B. Basically the circuit 700 only needs first power gate circuit (NAND 701) to have an additional device (device 561 in FIG. 5A).

Figure 7B:
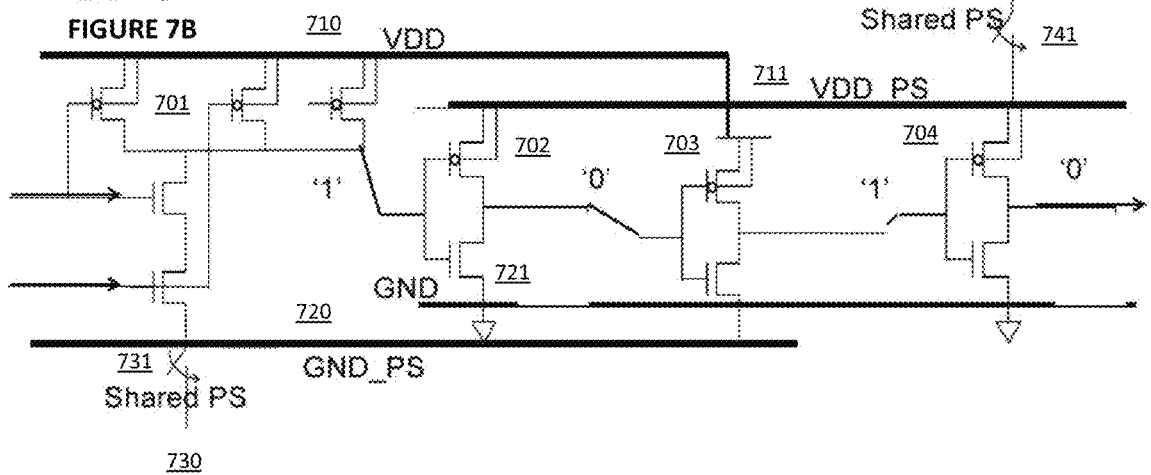

FIG. 7B depicts selection-decoding circuit 700 at a transistor level. During a power down event, it is desired to "save" the output values of NAND gate 701 and inverters 702, 703, and 704 even while the power source VDD and ground GND are turned off. Thus NAND gate 701 is coupled to the top ground line node 730 through switch 731, which can be a form of switch 521 or switch 522 in FIGS. 5A and 5B, in the manner shown in FIG. 7B. Node 730, which is coupled to ground power-save line 720 (also labeled as GND_PS) corresponds to node 511 or node 512 in FIGS. 5A and 5B. When switch 731 is opened (off), the output of NAND 701 will be a "1" and will remain in that state while switch 731 is closed. Inverter 703 also is coupled to ground power-save line 720 and will output a "1" during the power down mode. Thus, during a power down event, the outputs of NAND gate 701 and inverter 703 will be pulled up to a "1" state.

During the power down event, inverter 704 is coupled to top power supply line node 740 through switch 741, which can be a form of switch 421 or switch 422 in FIGS. 4A and 4B. Node 740, which is coupled to VDD power-save line 711 (also labeled as VDD_PS) corresponds to node 411 or node 412 in FIGS. 4A and 4B. Pulling VDD power-save line 711 to a "0" state will cause the output of inverter 704 to be "saved" as a "0." Inverter 702 also is coupled to VDD power-save line 711 and will have its output "saved" as a "0." Thus, during a power down event, the outputs of inverters 702 and 704 will be pulled down to a "0" state.

FIG. 8A depicts selection-decoding circuit 800, which comprises NAND gate 801 and inverters 802, 803, and 804 and is shown in symbolic fashion.

FIG. 8B depicts selection-decoding circuit 800 at a transistor level. During a power down event, it is desired to "save" the output values of NAND gate 801 and inverters 802, 803, and 804 even while the power source VDD and ground GND are turned off. Thus NAND gate 801 is coupled to top ground line node 830 through switch 831, which can be a form of switch 521 or switch 522 in FIGS. 5A and 5B, in the manner shown in FIG. 8B. Node 830, which is coupled to (local) ground power-save line 820 (also labeled as GND_PS) corresponds to node 511 or node 512 in FIGS. 5A and 5B. When switch 831 is opened, the output of NAND 801 will be a "1" and will remain in that state while switch 831 is opened. Inverter 803 also is coupled to ground power-save line 820 and will output a "1" during the power down mode. Thus, during a power down event, the outputs of NAND gate 801 and inverter 803 will be pulled up to a "1" state.

During the power down event, inverter 804 is coupled to top power supply line node 840 through switch 841, which can be a form of switch 421 or switch 422 in FIGS. 4A and 4B. Node 840, which is coupled to (local) VDD power-save line 811 (also labeled as VDD_PS) corresponds to node 411 or node 412 in FIGS. 4A and 4B. While switch 841 is opened (off), the output of inverter 804 to be "saved" as a "0." Inverter 802 also is coupled to VDD power-save line 811 and will have its output "saved" as a "0." Thus, during a power down event, the outputs of inverters 802 and 804 will be pulled down to a "0" state.

FIG. 8B also depicts bulk line 850 (also labeled as NWBULK), which provides a common bulk voltage for certain transistors in NAND gate 801 and inverters 802, 803, and 804, as shown in FIG. 8B. Implementation for bulk bias modulation to minimize power consumption and to maximize performance is as following. Voltage bias on the bulk line 850 is higher than the power supply VDD in power down or stand by mode to reduce leakage and lower than or equal to VDD in active mode to enhance gate current drive.

Test Mode Circuit

Figure 9:
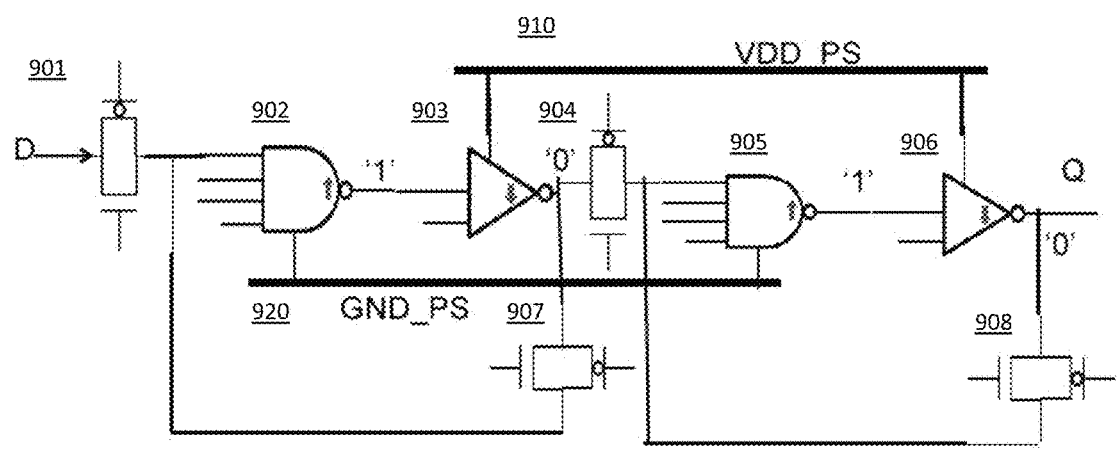
FIG. 9 depicts a test mode circuit.

FIG. 9 depicts test mode circuit 900, which comprises pass gates 901, 904, 907, and 908; NAND gates 902 and 905, and inverters 903 and 906 as shown. During a power down operation, the output of NAND gates 902 and 905 are pulled up to a "1" using ground power-save line 920 (also labeled as GND_PS), power save gate pull-up circuit 501 or pull-up circuit 502 (circuit technique of FIGS. 4A, 4B, 5A, and 5B) and the selection-decoding power save circuit techniques of FIGS. 6A, 6B, 7A, 7B, 8A, and/or 8B. During the power down operation, the output of inverters 903 and 906 are pulled down to a "0" using VDD power-save line 910 (also labeled as VDD_PS), power save gate pull-down circuit 401 or pull-down circuit 402 (circuit technique of FIGS. 4A, 4B, 5A, and 5B), and the techniques of FIGS. 6A, 6B, 7A, 7B, 8A, and/or 8B.

GPS Circuit

Figure 10:
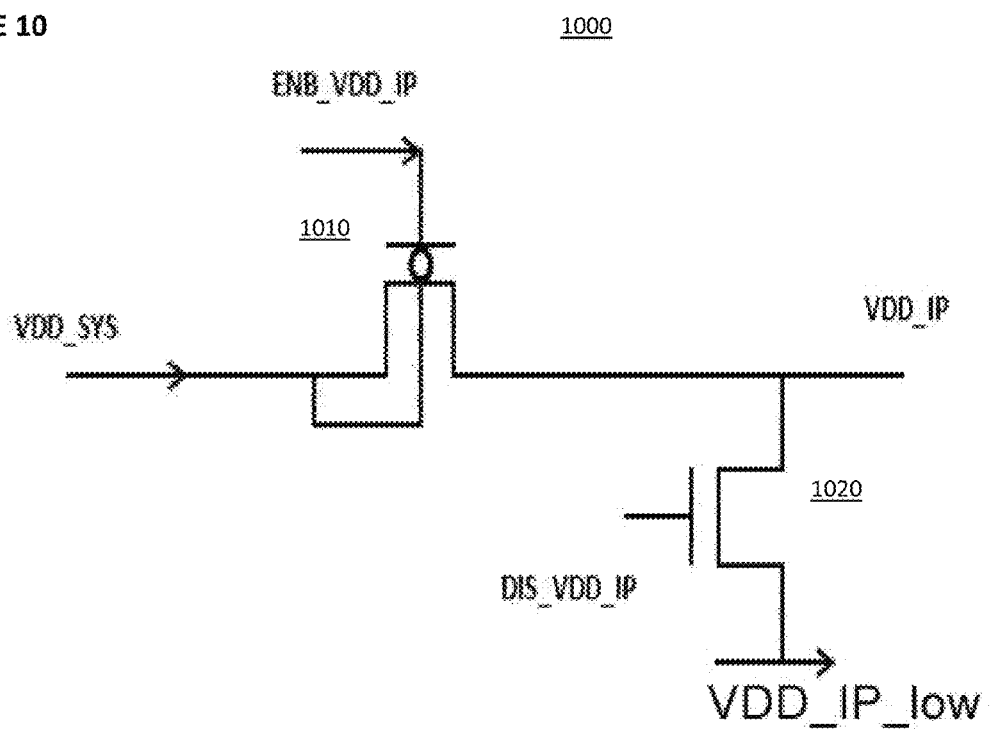
FIG. 10 depicts a global power switch circuit.

FIG. 10 depicts global power switch circuit 1000, which comprises PMOS transistor 1010 and NMOS transistor 1020 connected in the manner shown. Output VDD_IP will be the same as input VDD_SYS when the signal ENB_VDD_IP is low. Output VDD_IP will be pulled down to VDD_IP_LOW when the signal DIS_VDD_IP is high.

Local Power Switch Circuit

Figure 11A:
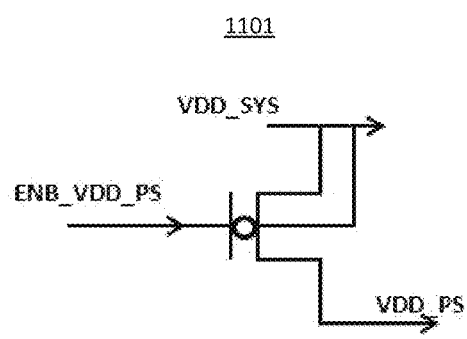
FIG. 11A and 11B depict local power switch circuits.

FIG. 11A depicts local power switch 1101, which comprises a PMOS transistor as shown. Output VDD_PS will be same as input VDD_SYS when the signal ENB_VDD_PS is low.

Figure 11B:
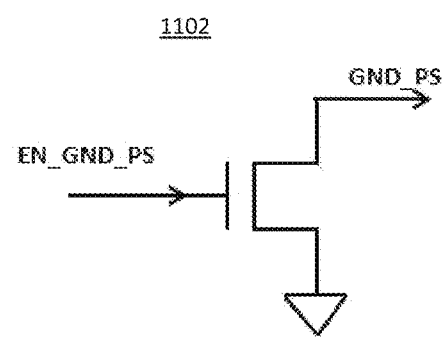

FIG. 11B depicts local power switch 1102, which comprises an NMOS transistor as shown. Output GND_PS will be pulled down to low (e.g., ground) when the signal EN_GND_PS is high.

Row Decoder

Figure 12:
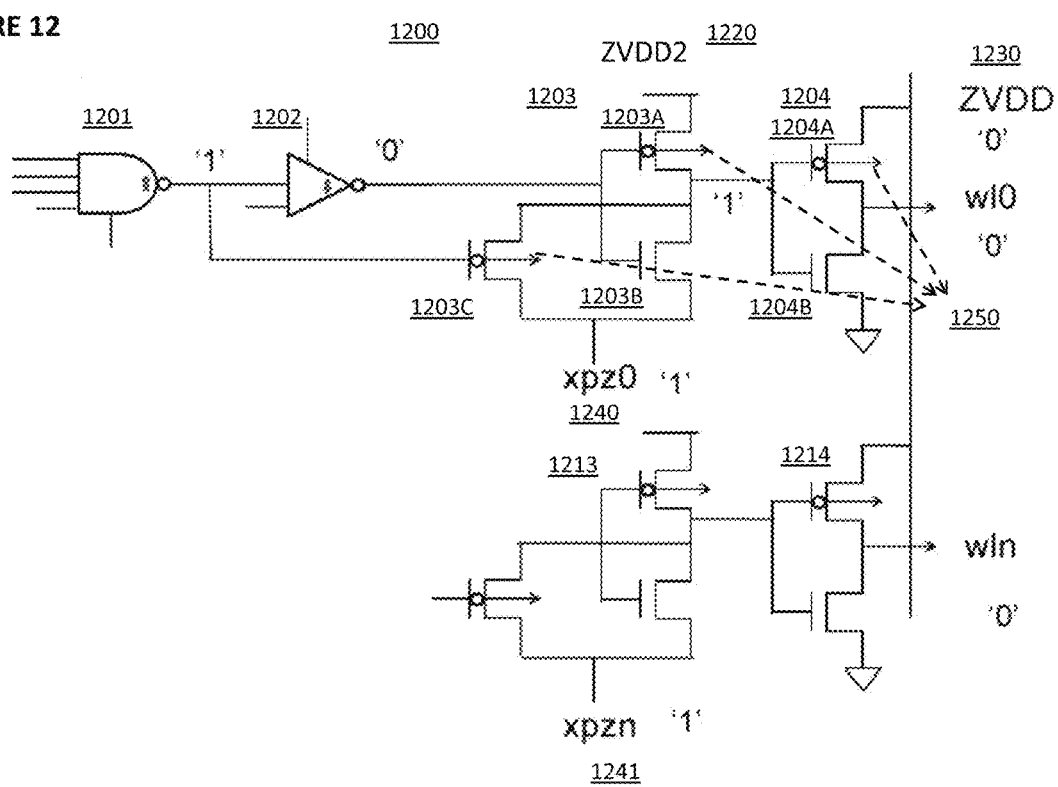
FIG. 12 depicts a row decoder circuit.

FIG. 12 depicts power save row decoder 1200. Row decoder 1200 comprises NAND gate 1201, inverter 1202, and circuit blocks 1203, 1204, 1213, and 1214. The circuit block 1203 includes PMOS 1203A, PMOS 1203C and NMOS 1203B. The circuit block 1204 includes PMOS 1204A and NMOS 1204B. The circuit blocks 1213 and 1214 are similar to circuit block 1203 and 1204 respectively, During a power down operation, the outputs of NAND gate 1201 and circuit blocks 1203 and 1213 are pulled up to a "1" using power save pull-up circuit 501 or pull-up circuit 502, and the techniques of FIGS. 6A, 6B, 7A, 7B, 8A, and/or 8B, and the outputs of inverter 1202 and circuit blocks 1204 and 1214 are pulled down to a "0" using power save pull-down circuit 401 or pull-down circuit 402, and the techniques of FIGS. 6A, 6B, 7A, 7B, 8A, and/or 8B. During a power down operation, power supply ZVDD 1230 can be shut down, which results in overall power savings. During a power down operation, node 1240 and 1241 are biased at a high voltage '1' so that voltage between source and drain of transistors 1203C and 1203B is the same, which results in overall power savings. During a power down operation, node nwell 1250 can be biased at a high voltage >ZVDD2 1220 and ZVDD 1230 to increase reverse bulk-source voltage leading to increase threshold voltage for PMOS 1203A and 1204A, which results in overall power savings.

Sensing Circuit

Figure 13:
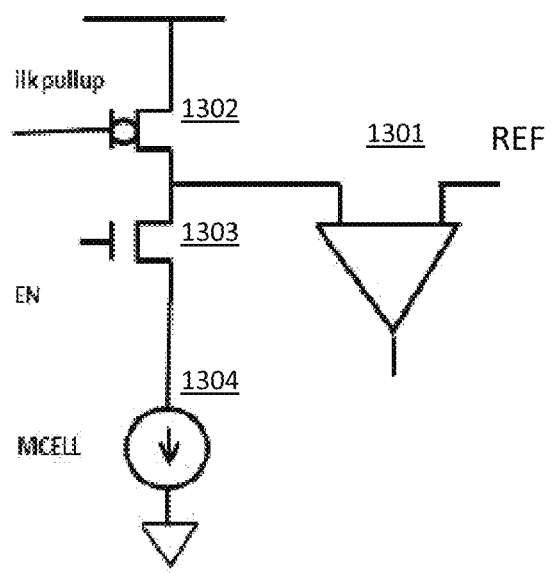
FIG. 13 depicts a sensing circuit.

FIG. 13 depicts sensing circuit 1300, which comprises comparator 1301, PMOS transistor 1302, NMOS transistor 1303, and selected memory cell 1304. The NMOS 1303 couples between the memory cell 1304 and the comparator 1301. The positive input of comparator 1301 is the node between PMOS transistor 1302 and NMOS transistor 1303, and the negative input of comparator 1301 is a reference voltage bias signal. The PMOS 1302 coupled to a high power supply is biased by a leakage current such as to compensate for array bit line leakage and/or leakage due to decoding path (such as from transistor direct gate tunneling current or junction). Thus, no reference memory cell is used for reading data from the selected memory cell 1304. In this mode, the effective reference for read sensing is basically ground reference level (zero current level), meaning the memory cell current window (difference between high (erased) and low (programmed) current level) has been shifted towards ground level. Meaning the low current level is shifted under the ground level. This can be implemented such as by biasing memory cell coupling gate at zero or negative voltage, and/or by very deep programming such as with higher programming voltage and/or with larger programming current and/or with longer programming time, and/or by biasing read bit line voltage at a low level.

Figure 14:
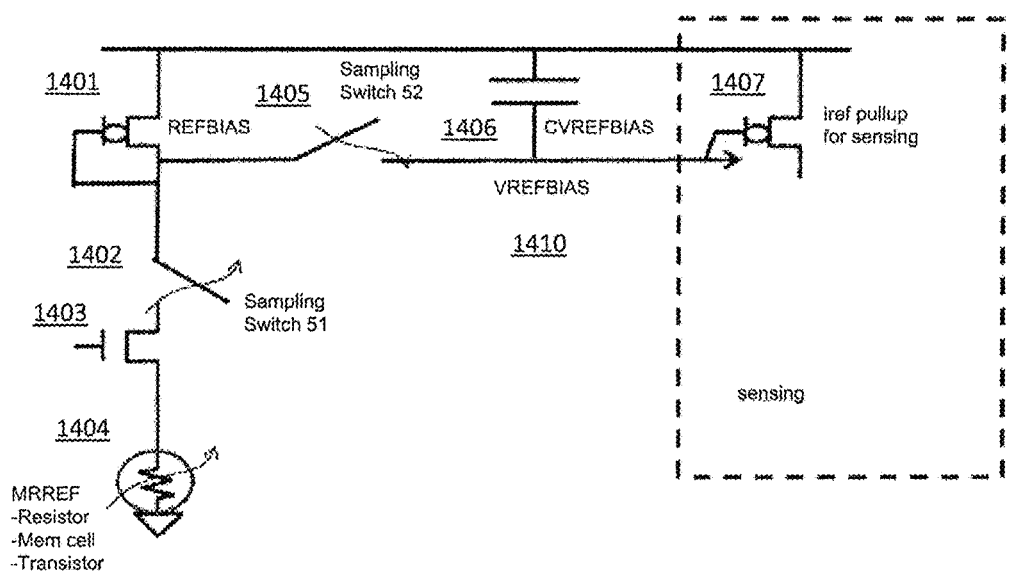
FIG. 14 depicts a sampling circuit for providing a sampled reference current to a sensing circuit.

FIG. 14 depicts a circuit 1400 for method of sampling a reference current (or a reference cell voltage) for a sensing operation, whereby a sampling current mirror (or a voltage) instead of a continuous current mirror (or a voltage) will be used, resulting in power savings. Circuit 1400 comprises sampling PMOS transistor 1401, sampling switches 1402 and 1405, enabling NMOS transistor 1403, reference element 1404 (which can be a resistor, memory cell, transistor, or other element), reference holding capacitor 1406 (this can be optional), floating hold node 1410 VREFBIAS (on terminal of the capacitor) and sensing pull up PMOS transistor 1407 (as part of sensing circuitry per selected bit line) as shown. The sampling interval is for example 0.2 us per 0.2 ms, hence effectively the effective power consumption from the reference current 1404 is reduced by a ratio of ~2/2000. The transistor 1401, 1402, 1403, 1404, 1405 are off during reference hold period (not sampling) and on during sampling period to sample bias on the reference element 1404 into the floating hold node 1410. The reference 1504 can be generated by as switching cap circuit (Req=1/R*Freq).

Figure 15:
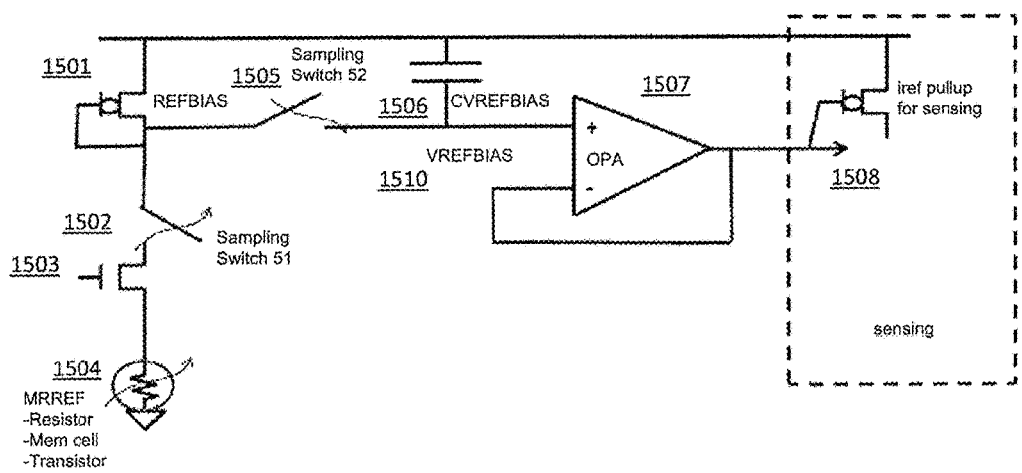
FIG. 15 depicts another sampling circuit for providing a sampled reference current to a sensing circuit.

FIG. 15 depicts a circuit 1500 for sampling a reference current (or a reference cell voltage) for a sensing operation, whereby a sampling current mirror (or a voltage) instead of a continuous current mirror (or a voltage) will be used, resulting in power savings. Circuit 1500 comprises sampling PMOS transistor 1501, sampling switches 1502 and 1505, enabling NMOS transistor 1503, reference element 1504 (which can be a resistor, memory cell, transistor, or other element), reference holding capacitor 1506, a floating hold node 1510 (on terminal of the capacitor 1506) operational amplifier 1507, and sensing pull up PMOS transistor 1508 (as part of sensing circuitry per selected bit line) as shown. The sampling interval is for example 2 us per 0.2 ms, hence effectively the effective power consumption from the reference current 1504 is reduced by a ratio of ~2/200. The transistor 1501, 1502, 1503, 1504, 1505 are off during reference hold period (not sampling) and on during sampling period to sample bias on the reference element 1504 into the floating hold node 1510. The op amp 1507 is used to drive the hold reference bias (voltage on capacitor 1506) into the gate of multiple of sensing transistor 1508.

Read Path

Figure 16:
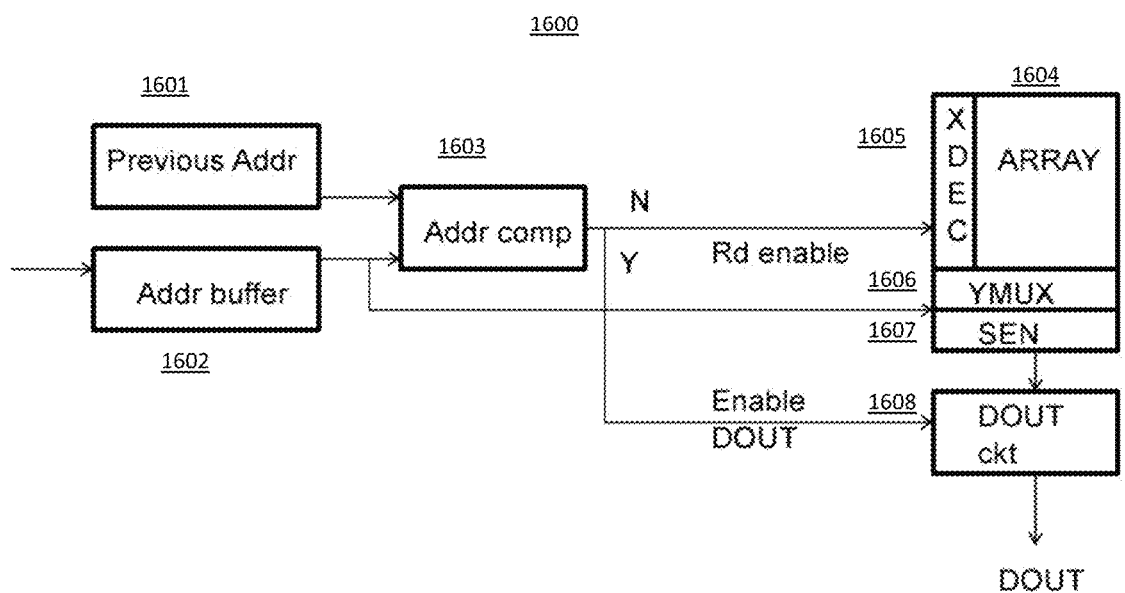
FIG. 16 depicts an embodiment of a read path for a memory device.

FIG. 16 depicts a read decoding path modulation embodiment of a flash memory system 1600 during a read operation to save power. Flash memory system 1600 implements a features that result in overall power savings, specifically, a sense operation does not occur if the same address is being read as was read during the previous cycle.

The read address for the current read operation is placed in buffer 1602. The address for the prior read operation is placed in buffer 1601. Comparator 1603 compares the address stored in buffer 1601 and the address stored in buffer 1601. If they are the same address, then an enable signal is sent to buffer 1608, which outputs the same output data as during the prior operation. If they are different addresses, then a read enable signal is sent to row decoder 1605 and column decoder 1606, and a normal read operation will occur in array 1604 using sensing circuit 1607. In another embodiment, if data out from sensing 1607 is same as that held in data out circuit 1608, then no DOUT switches which results in saving power in no DOUT switching.

Address/Data Encoding/Decoding/Scrambling

In a method of saving power by encoding/decoding/scrambling address and/or data, certain addressing and/or data accessing method are used to save power. In an embodiment for address encoding/decoding/scrambling, the consecutive word sequence is read consecutively with consecutive addressing (address incrementing) on the column (bit line) direction for N number of words starting at a selected row and selected columns. Such as following: word1-4 are on row1-4 consecutively, next word2-8 are on row1-4 consecutively for next selected columns, and this keep repeating. For this example an array unit sector includes four rows. In another embodiment for data encoding/decoding/scrambling, a mostly '0' state are used, meaning '1' data majority in a word will be converted to mostly '0' data in a word before storage. Other address scrambling are embodied such as by scrambling column addresses. Other address scrambling are possible such as by switching higher order row addresses ordering.

Power Gate Types

Figure 17:
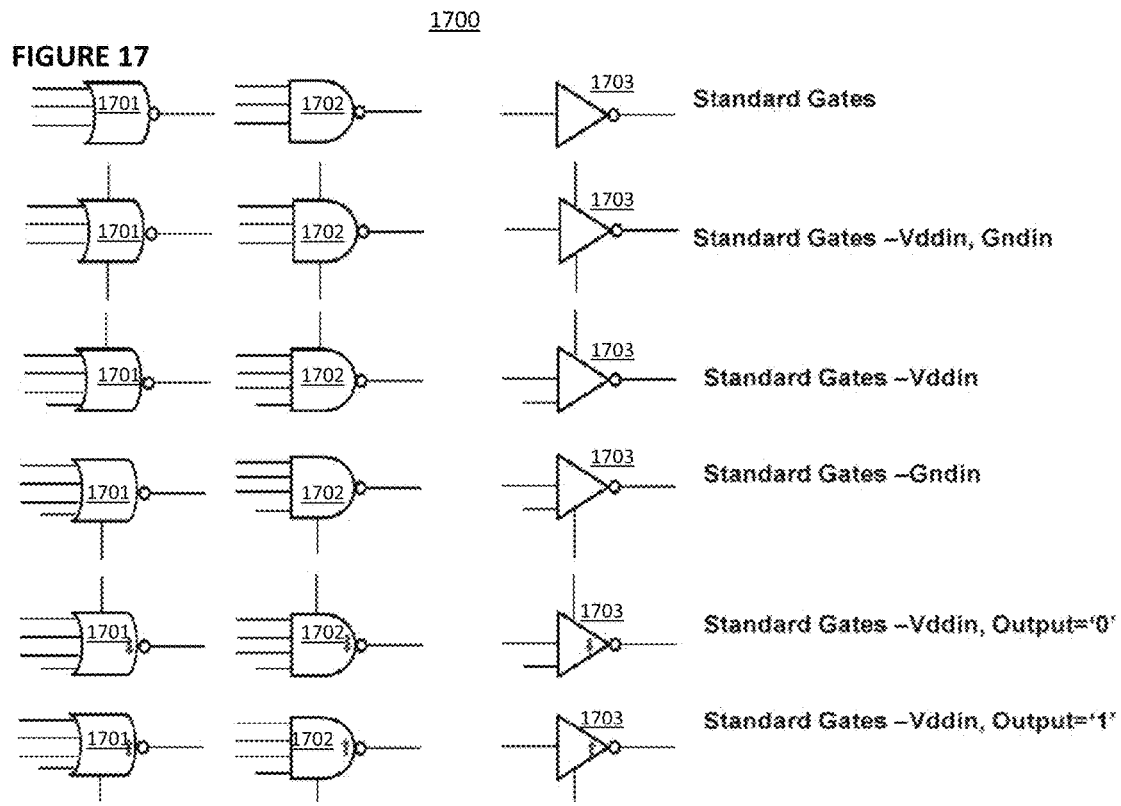
FIG. 17 depicts symbols of different gate configurations.

FIG. 17 depict various gate symbols and various configurations.

The first row depicts NOR gate 1701, NAND gate 1702, and inverter 1703 as standard gates.

The second row depicts NOR gate 1701, NAND gate 1702, and inverter 1703 with a voltage source of VDDin and a ground of GNDin.

The third row depicts NOR gate 1701, NAND gate 1702, and inverter 1703 with a voltage source of VDDin.

The fourth row depicts NOR gate 1701, NAND gate 1702, and inverter 1703 with a ground of GNDin.

The fifth row depicts NOR gate 1701, NAND gate 1702, and inverter 1703 with a voltage source of VDDin and connected to pull down circuit 401 or pull down circuit 402 to drive the output of the device to "0."

The sixth row depicts NOR gate 1701, NAND gate 1702, and inverter 1703 with a voltage source of VDDin and connected to pull up circuit 501 or pull up circuit 502 to drive the output of the device to "1."

What is claimed is:

1. A method of operating a non-volatile memory device comprising a sensing circuit coupled to a selected memory cell, the method comprising:
    closing one or more switches to cause the device to operate in a first mode, wherein during the first mode a reference element draws a current and the current is mirrored by a current mirror to generate a reference current, the current mirror comprising a first transistor and a second transistor; and
    opening the one or more switches to cause the device to operate in a second mode, wherein during the second mode the reference element is detached from the second transistor of the current mirror and the second transistor of the current mirror continues providing the reference current and the reference current is compared against a current drawn by a selected memory cell to determine a value stored in the selected memory cell.

2. The method of claim 1, wherein the first transistor of the current mirror is a PMOS transistor and the second transistor of the current mirror is a PMOS transistor.

3. The method of claim 2, wherein a gate of the second transistor of the current mirror is coupled to a capacitor.

4. The method of claim 1, wherein the non-volatile memory device comprises an array of split gate memory cells.

5. The method of claim 1, wherein the reference element is a memory cell.

6. The method of claim 1, wherein the reference element is a resistor or a capacitor.

7. The method of claim 2, wherein a gate of the second transistor of the current mirror is coupled to an operational amplifier.

8. A non-volatile memory device comprising:
    a selected memory cell;
    a sensing circuit coupled to a selected memory cell; and
    a circuit comprising a current mirror and one or more switches, the current mirror comprising a first transistor and a second transistor, wherein when the one or more switches are closed, a reference element draws a current from the first transistor and the current is mirrored in the second transistor as a reference current, and when the one or more switches are open, the reference element is detached from the second transistor and the second transistor provides the reference current to the sensing circuit to determine a value stored in the selected memory cell.

9. The device of claim 8, wherein the first transistor of the current mirror is a PMOS transistor and the second transistor of the current mirror is a PMOS transistor.

10. The device of claim 9, wherein a gate of the second transistor of the current mirror is coupled to a capacitor.

11. The device of claim 8, further comprising an array of split gate memory cells.

12. The device of claim 8, wherein the reference element comprises a memory cell.

13. The device of claim 8, wherein the reference element is a resistor or a capacitor.

14. The device of claim 9, wherein a gate of the second transistor of the current mirror is coupled to an operational amplifier.

* * * * *